United States Patent
Nentwig et al.

(10) Patent No.: US 8,502,501 B2
(45) Date of Patent: Aug. 6, 2013

(54) BATTERY MEASURING CLAMP

(75) Inventors: Dominik Nentwig, Werne (DE); Frank Gronwald, Bedburg (DE); Franz-Josef Lietz, Oberhausen-Lirich (DE)

(73) Assignee: Auto Kabel Managementgesellschaft mbH, Hausen i.W. (DE)

( * ) Notice: Subject to any disclaimer, the term of this patent is extended or adjusted under 35 U.S.C. 154(b) by 319 days.

(21) Appl. No.: 12/989,851

(22) PCT Filed: Dec. 8, 2009

(86) PCT No.: PCT/EP2009/066596
§ 371 (c)(1),
(2), (4) Date: Oct. 27, 2010

(87) PCT Pub. No.: WO2010/066713
PCT Pub. Date: Jun. 17, 2010

(65) Prior Publication Data
US 2011/0050240 A1     Mar. 3, 2011

(30) Foreign Application Priority Data
Dec. 8, 2008   (DE) .......................... 10 2008 060 668

(51) Int. Cl.
*H01M 10/44*   (2006.01)
*H01M 10/46*   (2006.01)

(52) U.S. Cl.
USPC ........................................................ 320/111

(58) Field of Classification Search
USPC .......... 320/105, 107, 111, 114, 115; 439/775, 439/620.01
See application file for complete search history.

(56) References Cited

U.S. PATENT DOCUMENTS

| | | | |
|---|---|---|---|
| 4,675,255 A * | 6/1987 | Pfeifer et al. | 429/92 |
| 6,218,805 B1 | 4/2001 | Melcher | 320/105 |
| 7,381,101 B2 | 6/2008 | Roset et al. | 439/754 |
| 7,491,097 B2 * | 2/2009 | Ishihara et al. | 439/763 |

(Continued)

FOREIGN PATENT DOCUMENTS

| | | |
|---|---|---|
| DE | 20318266 U1 | 2/2004 |
| DE | 202004019235 | 5/2005 |

(Continued)

OTHER PUBLICATIONS

German Patent Office, Office Action, Application No. 10 2008 060 668.5, dated Apr. 22, 2013, 7 pages.

(Continued)

*Primary Examiner* — Edward Tso
(74) *Attorney, Agent, or Firm* — Sunstein Kann Murphy & Timbers LLP

(57) ABSTRACT

A battery measuring clamp, comprising a battery pole clamp 2, a measuring resistor 12 electrically connected to the battery pole clamp 2, and an evaluation circuit which evaluates at least the voltage across the measuring resistor 12, wherein the evaluation circuit is electrically connected to the measuring resistor 12 via at least two measuring contacts 18 and at least two data lines 24 are arranged on the evaluation circuit. A flexible use of such a battery measuring clamp is ensured by the fact that the data lines are arranged in a connection means 26, that a data connector 32 is monolithically connected to a coupling means 28 corresponding to the connection means 26, and that the coupling means 28 and the connection means 26 are plugged together in order to electrically contact the data connector 32 to the data lines 24.

27 Claims, 8 Drawing Sheets

U.S. PATENT DOCUMENTS

| | | | |
|---|---|---|---|
| 7,500,888 B2 | 3/2009 | Roset et al. | 439/754 |
| 7,573,274 B2 | 8/2009 | Aratani | 324/713 |
| 7,578,710 B2 | 8/2009 | Koelle et al. | 439/762 |
| 7,688,022 B2 * | 3/2010 | Alvarez-Troncoso et al. | 320/104 |
| 2005/0206387 A1 | 9/2005 | Hirthammer | 324/426 |
| 2007/0194747 A1 | 8/2007 | Alvarez-Troncoso et al. | 320/104 |
| 2008/0194152 A1 | 8/2008 | Roset et al. | 439/754 |

FOREIGN PATENT DOCUMENTS

| | | |
|---|---|---|
| DE | 102004013659 | 10/2005 |
| DE | 102006038373 | 2/2008 |
| DE | 102007034757 | 2/2008 |
| DE | 102007027916 | 3/2008 |
| DE | 102008066042 | 8/2008 |
| DE | 102007018669 A1 | 10/2008 |
| GB | 2441211 A | 2/2008 |

OTHER PUBLICATIONS

Cohausz & Florack, English Translation: German Office Action, Application No. 10 2008 060 668.5, dated Apr. 22, 2013, 3 pages.

* cited by examiner

BATTERY MEASURING CLAMP

TECHNICAL FIELD

The subject-matter relates to a battery measuring clamp with a battery pole clamp, a measuring resistor electrically connected to the battery pole clamp, and an evaluation circuit which evaluates at least the voltage across the measuring resistor, wherein the evaluation circuit is electrically connected to the measuring resistor via at least two measuring contacts and at least two data lines are arranged on the evaluation circuit. The invention also relates to a method for producing such a battery measuring clamp.

BACKGROUND ART

Battery measuring clamps are becoming increasingly important in automobile manufacture due to the increasing number of comfort-related consumers in modern motor vehicles. Due to the increasing number of comfort-related consumers, the power consumption during rest times of the vehicle is also increasing. The battery has to supply the comfort-related consumers with power even in rest times of the vehicle, which leads to a constant, if slow, discharging of the battery.

In order to allow starting of an internal combustion engine, a sufficiently high current must be available on the starter at the time of starting. This can be provided only if the battery is sufficiently charged. If, during relatively long rest times, there is a partial discharging of the battery below a minimum state of charge, reliable starting of the internal combustion engine can no longer be ensured.

In order to prevent the battery from being discharged below a minimum state of charge, battery measuring clamps are used. The battery measuring clamps measure at least a voltage drop across a measuring resistor (shunt). Based on the voltage drop, it is possible to draw conclusions about the current flow. Furthermore, using suitable evaluation means, the battery temperature and also other physical parameters of the battery can be evaluated directly on the battery measuring clamp by means of an evaluation circuit. The measured parameters can be used to draw conclusions about the state of charge of the battery. In particular, the use of the parameters current, voltage and temperature makes it possible to detect and output the charge state of the battery. Based on such an evaluation, it is possible to switch off comfort-related consumers rather than discharging the battery below a minimum state of charge.

The battery measuring clamps are usually installed directly in the pole recess on the battery pole. The values measured by the battery measuring clamp can be tapped off via a data line. However, due to a large number of different plug systems in automobile manufacture, there are problems in terms of making the data available to the on-board management system of the vehicle using an inexpensive solution. Different plug variants are necessary in order to meet different manufacturers' requirements for a data interface.

SUMMARY OF THE INVENTION

For this reason, the object was to provide a battery measuring clamp which can be used in a flexible manner and is inexpensive to produce.

According to one aspect, this object is achieved in that the data line is arranged in a connection means, in that a data connector is monolithically connected to a coupling means which corresponds to the connection means, and in that the coupling means and the connection means are plugged together in order to electrically contact the data connector to the data lines.

It has been found that different data connectors in the form of different plugs or sockets have to be provided with the battery measuring clamp according to the subject-matter. However, it has also been found that the loading of the production tools for the battery measuring clamp and also the alignment of the production tools is laborious when a different machine set-up must take place for each type of data connector. For this reason, it is proposed that a connection means is provided in the battery measuring clamp, into which the data lines are passed.

Furthermore, it has been found that a data connector can be monolithically connected to a coupling means, for example by means of an injection moulding process. It is thus possible to monolithically connect different types of plugs and sockets as data connectors to the coupling means.

In order to allow mass manufacture of the battery measuring clamp and at the same time to allow an individual adaptation of the data connector, it is proposed that the coupling means correspond to the connection means and the coupling means can be plugged into the connection means. Via the connection means and the coupling means, an electrical contacting of the data line arranged in the battery measuring clamp to the data connector and the contacts provided therein takes place. It is thus possible according to the invention to produce the battery measuring clamp with the connection means and the data lines in a process which is independent of the type and shape (shape factor) of the data connector. Depending on manufacturers' requirements, the data connector is monolithically connected to the coupling means. Via the coupling means, the data connector can be connected to the connection means and an electrical contacting of the data connector to the data line can take place. This makes it possible to meet different manufacturers' requirements for different data connectors such as plugs and sockets and at the same time to establish an inexpensive method for a battery measuring clamp.

Once the battery measuring clamp with the connection means has been produced and the data connector has been monolithically connected to the coupling means, the coupling means can be plugged into the connection means and the data connector can be electrically connected to the data line.

According to one advantageous embodiment, it is proposed that the data connector is injection-moulded or cast with the coupling means. In this case it is possible to place the data connector into a pre-shaped injection and/or casting mould and to injection-mould or cast it together with the coupling means using a material, for example styrene polymers, such as polystyrene, SAN, ABS, SBS, ASA, MABS and ABS/PA blend, and construction materials such as PA, PBT, POM, PES and PSU, for example using suitable synthetic resins. In this case it is possible that the shape of the coupling means is predefined by the casting mould, so that the coupling means fits the connection means.

According to one advantageous embodiment, it is proposed that the data connector is a plug specific to the manufacturer or a socket specific to the manufacturer. In the motor vehicle industry, different types of plugs have become established for different manufacturers. Each manufacturer requires its suppliers to make it possible for electrical signals to be tapped off via the plugs and/or sockets prescribed by said manufacturer. With the battery measuring clamp according to the invention, it is possible to connect different plugs or sockets to the battery measuring clamp in an inexpensive manner by connecting standardised connection means to standardised coupling means, wherein the coupling means are monolithically connected to the different plugs or sockets.

According to one advantageous embodiment, it is proposed that the connection means and the coupling means are a plug/socket pair corresponding to one another. The connection means and the coupling means can thus be plugged together.

According to one advantageous embodiment, it is proposed that the connection means can be connected to the coupling means with a force-fit (force closure) and/or form-fit (form closure) when they are plugged together. When the connection means and the coupling means are plugged together, an electrical contact is also established between the data lines and the contacts within the data connector. In order to allow good electrical contacting, a force-fit and/or form-fit connection between the coupling means and the connection means is useful, since otherwise loose contacts could occur.

Besides different requirements with regard to the types of plug, cable ducts within the motor vehicle, particularly in the vicinity of the battery in the engine compartment or trunk, are also manufacturer-specific. Different cable outlets of the data lines are required by the manufacturers in order to achieve as short as possible signal paths and to meet other installation space requirements of a type of motor vehicle. For this reason it is proposed that, according to one advantageous embodiment, the data connector runs parallel to the extension direction of the measuring resistor. The current path runs from the battery pole via the battery pole clamp, a coupling barbar and the measuring resistor to an electrical tap-off. The data connector may run parallel to the flow direction of the electrical current across the measuring resistor. The data connector may thus be located in the continuation of the measuring resistor on the battery measuring clamp.

It is also possible that the data connector runs orthogonal to the extension direction of the measuring resistor. In this case, a tap-off may take place to the side of the measuring resistor.

The battery measuring clamp is usually arranged in a pole recess. One possible configuration provides that the data connector runs in a pole recess between the battery measuring clamp and a pole recess wall of a battery.

It is also possible that the data connector runs parallel to the outer edge of a battery in a pole recess of the battery.

According to one advantageous embodiment, it is likewise proposed that the data connector runs perpendicular to the outer edge of a battery in a pole recess of the battery.

In order to contact the measuring resistor to the battery pole clamp, it is proposed that a coupling barbar is arranged in an outlet direction on the battery pole clamp. The measuring resistor may be arranged on this coupling barbar. The coupling barbar thus forms an electrical contact to the battery pole clamp, and also a mechanical hold for the measuring resistor. The battery pole clamp with the coupling barbar may be forged in one piece.

The coupling bar may be a flat part. This makes it possible to design the measuring device together with the measuring resistor and the evaluation circuit in a flat manner.

In order to be able to apply the measuring resistor to the coupling bar, it is proposed that the measuring resistor is a flat part. The measuring resistor may in this case be arranged on the coupling bar in a manner parallel to the coupling bar.

The coupling bar extends in the outlet direction from the battery pole clamp. The measuring resistor may be arranged on the coupling bar perpendicular to this outlet direction.

In order to connect the measuring resistor to the coupling bar, it is proposed that the coupling bar has a connecting bar protruding from the plane of the flat part. Part of the measuring resistor can be electrically contacted to this connecting bar.

In order to mechanically connect the measuring resistor to the coupling bar and also to provide a sufficiently large measurement path, it is proposed that an insulating bar is arranged on the plane of the coupling bar, out of which the connecting bar protrudes, on the side of the coupling bar opposite the connecting bar. The measuring resistor can then bear both against the coupling bar and against the insulating bar and a measurement path can lie between the coupling bar and the insulating bar, between which a voltage drop across measuring contacts can be tapped off. The measuring contacts may be arranged on the measuring resistor.

According to one advantageous embodiment, it is proposed that the measuring resistor bears against the connecting bar and the insulating bar. This makes it possible on the one hand to electrically contact the measuring resistor to the connecting bar and on the other hand to make the connection between the measuring resistor and the coupling bar mechanically stable.

In order to ensure a reliable measurement of the voltage drop, a voltage drop across a shunt resistor is measured. For this reason, it is proposed that the measuring resistor is formed of two conductor parts and a resistor material arranged therebetween. The conductor parts may bear for example on the one hand against the coupling bar and on the other hand against the insulating bar, and the resistor material may be free of contacts with the coupling bar so that a current flow across it causes a defined voltage drop which can be evaluated.

In order to be free in the outlet direction of the data connector, in particular to be able to ensure an outlet of the data connector in the direction of the battery pole of a battery pole clamp, it is proposed that the connection means lies outside a projection surface of the battery pole clamp, said projection surface being located in the outlet direction.

Protection against mechanical stress and also against environmental influences is made possible by the fact that the coupling bar is embedded with the measuring resistor in a material, and that the measuring contacts and an electrical tap-off on the measuring resistor are free of the material. In particular, it is possible in an injection-moulding and/or casting process to inject material around or to embed in a housing and cast with a resin or the like the coupling bar and the measuring resistor. The materials may be those already mentioned above.

For electrical contacting, at least the measuring contacts must be free of the material. It is also necessary that an electrical tap-off for the feed line to electrical consumers is free of the material in order to allow electrical contacting.

It is also proposed that the holder is embedded with the measuring resistor in a material in such a way that the connection means is formed by the material. The material can thus be shaped in such a way that it forms the connection means.

In order to prevent the data connector from being in physical competition with an electrical tap-off which leads to the consumers, it is proposed that the connection means and the electrical tap-off are arranged on opposite sides of the measuring resistor. Both the outlet direction of the electrical tap-off and the outlet direction of the data connector can thus be freely selected and are not in conflict with the respective other outlet direction.

In order to be able to evaluate the measured values obtained by means of the measuring resistor, it is proposed to provide an evaluation circuit. This evaluation circuit must come into electrical contact with the measuring contacts. For this reason it is proposed that the material in the region of the measuring contacts forms a holder for the evaluation circuit. Therefore, already at the time of casting and/or injection-moulding of the measuring contacts with the coupling bar, a depression can be provided which forms a holder for an evaluation circuit. The evaluation circuit can be inserted into this holder.

According to one advantageous embodiment, the evaluation circuit is a populated printed circuit board. A particularly space-saving assembly is possible if the populated side of the printed circuit board faces towards the measuring contacts. Furthermore, in this case, during assembly, the populated printed circuit board can be placed onto the measuring contacts and soldered, for example in a reflow soldering process, without the components on the evaluation circuit being damaged due to heat.

In order to protect the evaluation circuit against environmental influences, it is proposed that a cover is arranged over the evaluation circuit in a manner bonded to the material. This bonding may take place for example by means of laser plastic welding.

The subject-matter also relates to a method for producing a battery measuring clamp by electrically connecting a battery pole clamp to a measuring resistor, electrically connecting an evaluation circuit to the measuring resistor via at least two measuring contacts, and arranging at least two data lines on the evaluation circuit, characterised by arranging the data lines in a connection means, monolithically connecting a data connector to a coupling means corresponding to the connection means, and electrically contacting the data connector to the data lines by plugging together the coupling means and the connection means.

BRIEF DESCRIPTION OF THE DRAWINGS

The invention will be explained in more detail below with reference to a drawing which shows exemplary embodiments. In the drawings.

DETAILED DESCRIPTION OF SPECIFIC EMBODIMENTS

Figure 1:
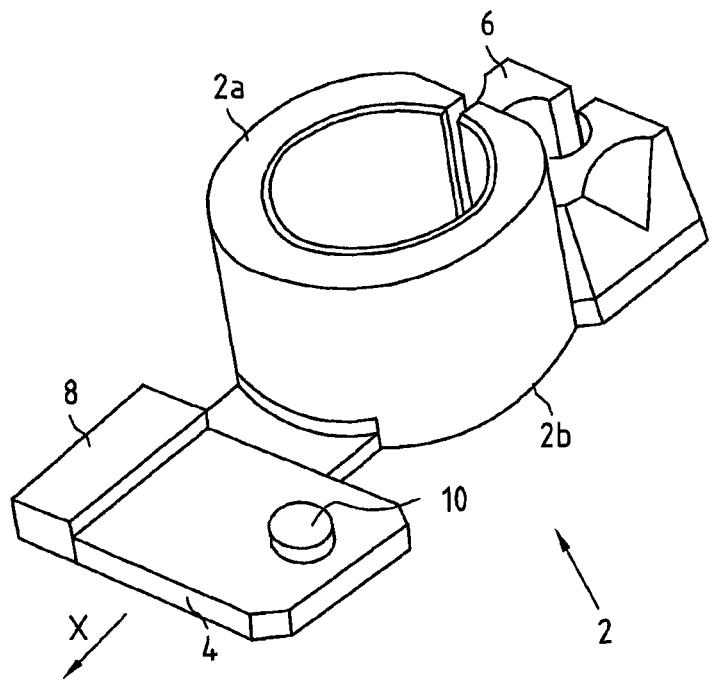
FIG. 1 shows a battery pole clamp with a coupling bar.

FIG. 1 shows a battery pole clamp 2 with two clamping jaws 2a, 2b and a coupling bar 4.

The clamping jaws 2a, 2b can be moved relative to one another by means of the screwing on the screwing device 6 in order to be connected with a force fit to a battery pole (not shown).

The battery pole clamp 2 with the coupling bar 4 can be forged in one piece. As can be seen, the coupling bar 4 is arranged in an outlet direction X starting from the battery pole clamp 2. Furthermore, the coupling bar 4 is formed in such a way that a connecting bar 8 protrudes out of the plane of the coupling bar 4 and an insulating bar 10 is arranged on the side of the coupling bar 4 opposite the connecting bar 8. The insulating bar 10 may be for example a stopper formed from plastic, which is inserted into a hole in the coupling bar 4. A measuring resistor 12, as will be described below, can be placed onto the connecting bar 8 and the insulating bar 10.

Figure 2:
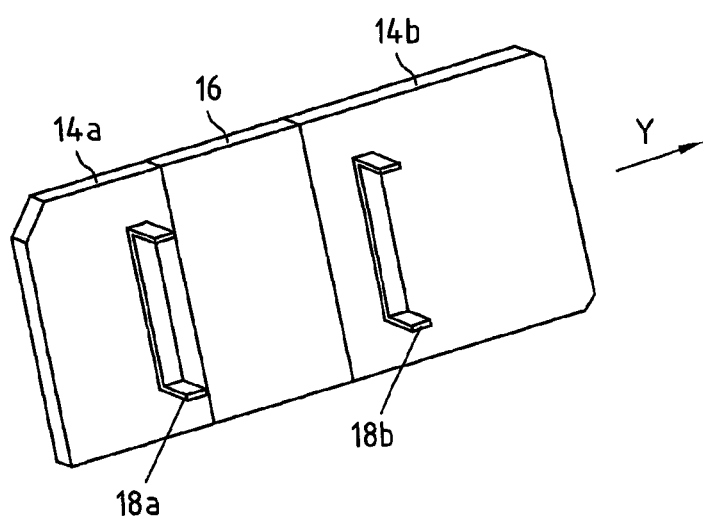
FIG. 2 shows a measuring resistor.

FIG. 2 shows a view of a measuring resistor 12 with a first conductor part 14a and a second conductor part 14b and a resistor material 16 arranged between the conductor parts 14. The conductor parts 14 may be formed for example from copper or other conductive nonferrous metals or alloys thereof. The resistor material may be for example a copper-manganese-(nickel and/or tin) alloy.

As can be seen, the measuring resistor 12 is formed as a flat part. Measuring contacts 18a, 18b are arranged on the conductor parts 14a, 14b in a materially bonded manner. The measuring contacts 18 are arranged flat against the conductor parts 14 and protrude from the plane of the measuring resistor 12. The feet of the measuring contacts 18 protruding from the plane of the measuring resistor 12 serve for electrically contacting the measuring contacts 18 to an evaluation circuit.

A current flow can run in the extension direction Y of the measuring resistor 12. The current flows across the conductor part 14a, the resistor material 16 and the conductor part 14b. Across the resistor material 16, a voltage drop takes place in a manner depending on the current and the resistance of the resistor material 16, which voltage drop can be tapped off by means of the measuring contacts 18 and evaluated in an evaluation circuit.

Figure 3:
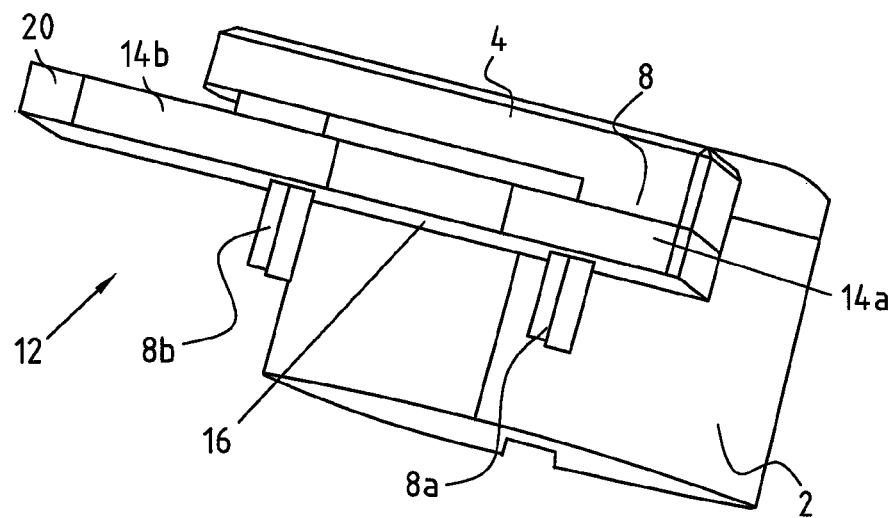
FIG. 3 shows a battery pole clamp with a measuring resistor.

FIG. 3 shows a battery pole clamp 2 in a view assembled with a measuring resistor 12. It can be seen in this view that the measuring resistor 12 at one side bears against the connecting bar 8 in an electrically contacted manner and at the other side bears electrically opposite the coupling bar 4 against the insulating bar 10 and thus runs parallel to the coupling bar 4. An electrical tap-off 20 for connecting the battery to a feed line to consumers may be formed at one end of the measuring resistor 12.

Figure 4:
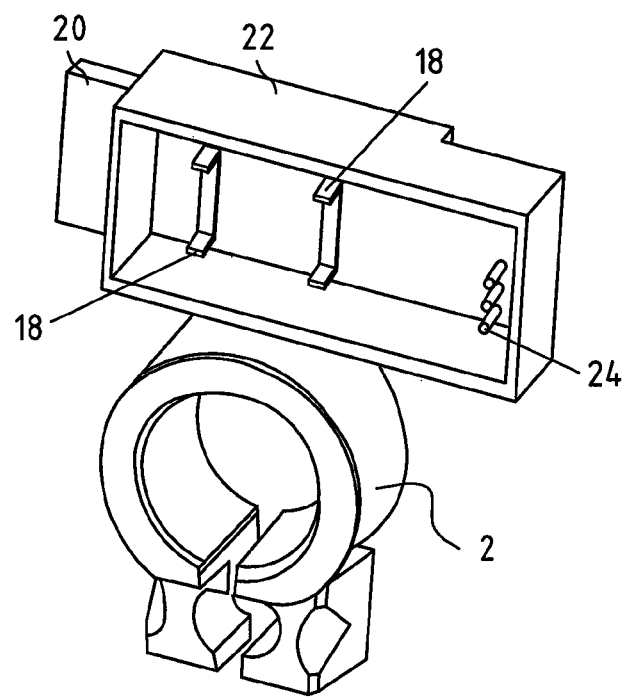
FIG. 4 shows a battery pole clamp with a measuring resistor around which material has been injected.

The coupling bar 4, the connecting bar 8, the insulating bar 10, the measuring resistor 12 and partially the measuring contacts 18 may be cast into a housing, as shown in FIG. 4. FIG. 4 shows a view of a battery pole clamp 2 from below, in which the coupling bar 4, the measuring resistor 12, the connecting bar 8, the insulating bar 10, the measuring contacts 18 at least partially and likewise at least partially the electrical tap-off 20 are cast into a housing 22. It can be seen that only the measuring contacts 18 protrude from the casting material, but otherwise the measuring resistor 12 and the coupling bar 4 are cast into the housing 22. Electrical contacts 24 in the region of the housing 22 can also be seen. The electrical contacts 24 pass through the housing 22 and can be electrically contacted on both sides of the housing 22. The electrical contacting of the electrical contacts 24 on the side of the housing 22 that is not shown is shown in FIG. 5 and will be explained in greater detail therein.

The measuring contacts 18 and also the electrical contacts 24 can be electrically contacted via an evaluation circuit. An evaluation circuit can be placed with its populated side facing towards the electrical contacts onto the electrical measuring contacts 18 and also the electrical contacts 24. By way of example, it is possible that the measuring contacts 18 and also the electrical contacts 24 are inserted into bores of a printed circuit board of the evaluation circuit. An electrical contacting of the evaluation circuit to the measuring contacts 18 and the electrical contacts 24 may take place for example from the upper side by means of a soldering process, for example by means of reflow soldering. A mechanical contacting of the measuring contacts 18 and/or electrical contacts 24 is also possible, for example by means of press-fit contacts. The measuring contacts 18 and also the electrical contacts 24 are thus electrically contacted to an evaluation circuit. The evaluation circuit can evaluate at least the voltage drop across the measuring contacts 18 and can transmit to the electrical contacts 24 an evaluation result in the form of data pulses.

Figure 5:
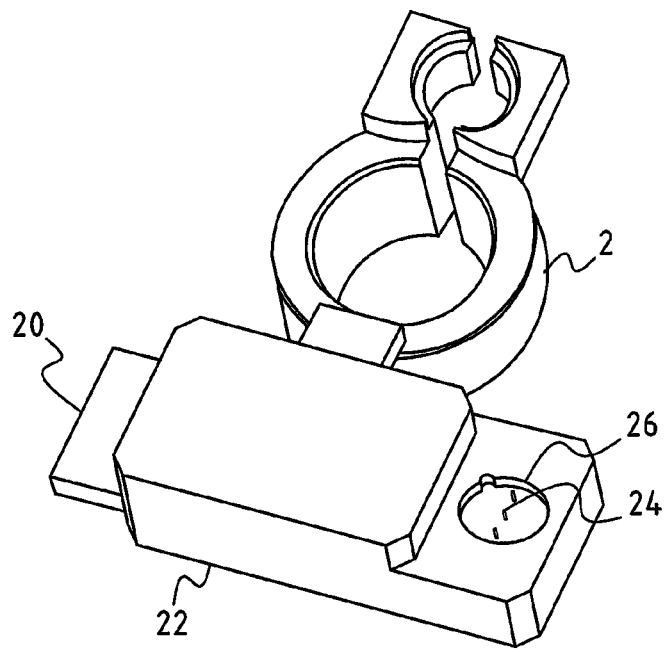
FIG. 5 shows a battery pole clamp with a connection means.

FIG. 5 shows the upper side of the battery pole clamp 2 shown in FIG. 4. It can be seen that, on one side, the electrical tap-off 20 is located outside the housing 22. On the side of the housing 22 opposite the electrical tap-off 20, it is possible to see a connection means 26 in the form of a socket. The electrical contacts 24 are arranged in the connection means 26. The connection means 26 is a depression in which the electrical contacts 24 are arranged. The connection means 26 may also be a plug or some other type of electrical connection for connecting the electrical contacts 24 to a corresponding coupling means 28.

Figure 6:
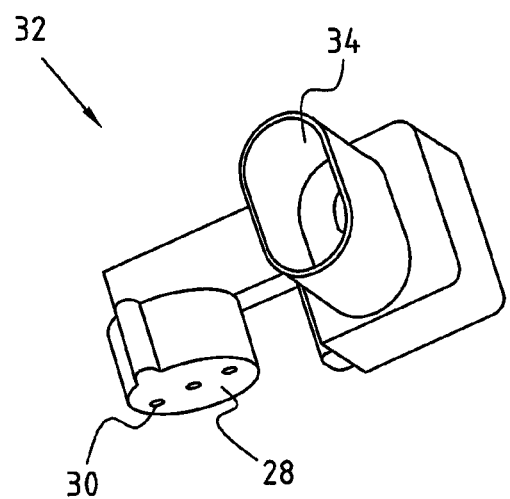
FIG. 6 shows a coupling means with a data connector.

Such a coupling means 28 is shown by way of example in FIG. 6. FIG. 6 shows a coupling means 28 shaped as a plug. The outer jacket surface of the coupling means 28 corresponds to the inner jacket surface of the connection means 26. Arranged in the coupling means 28 are electrical contacts 30 which correspond spatially to the electrical contacts 24 in the connection means 26. The coupling means 28 can be plugged into the connection means 26 and locked into the latter. To this end, a suitable latching protrusion may be provided for example in the connection means 26. During the insertion of the coupling means 28 into the connection means 26, an electrical contacting of the electrical contacts 24 to the electrical contacts 30 takes place.

FIG. 6 furthermore shows that the coupling means 28 is formed monolithically, in one piece with a data connector 32 having a plug face 34. The data connector 32 may be formed in the shape of a plug. The electrical contacts 28 are conducted inside the housing of the data connector 32 to corresponding contacts within the plug face 34.

It can be seen that the coupling means 28 are formed in one piece with the plug face 34 of the data connector 32. This is possible for example by means of injection moulding. By way of example, it is possible to monolithically connect the coupling means 28 and the plug face 34 to one another in an injection mould, wherein a liquid plastic is injected into the injection mould and the plug face 34 is connected to the coupling means 28 in a materially bonded manner.

With the aid of the coupling means 28, it is possible to establish an electrical connection to the electrical contacts 24 in the connection means 26. The coupling means 28 can be standardised and can fit the standardised connection means 26. By monolithically connecting the data connector 32 to the coupling means 28, it is possible to provide a standardised coupling means 28 with different plug faces 34, which can then be connected to the standardised connection means 26.

Figure 7:
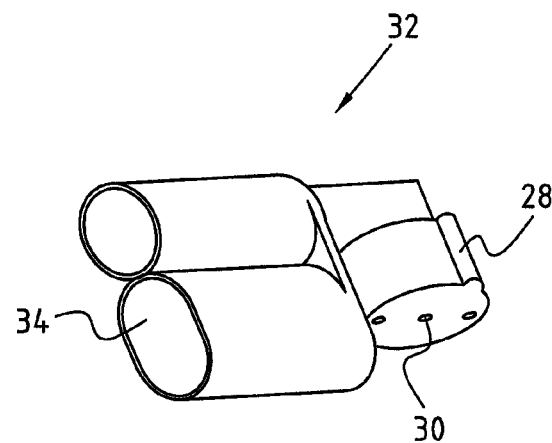
FIG. 7 shows a further coupling means with a data connector.

FIG. 7 shows a further configuration of a data connector 32 with a plug face 34 and a coupling means 28. It can be seen that the plug face 34 shown in FIG. 7 is completely different from the plug face 34 shown in FIG. 6. However, it can also be seen that the coupling means 28 in FIG. 6 and FIG. 7 are identical. All of these coupling means fit the connection means 26 and thus allow a contacting of different plug faces 34 or data connectors 32 to the standardised connection means 26.

Figure 8:
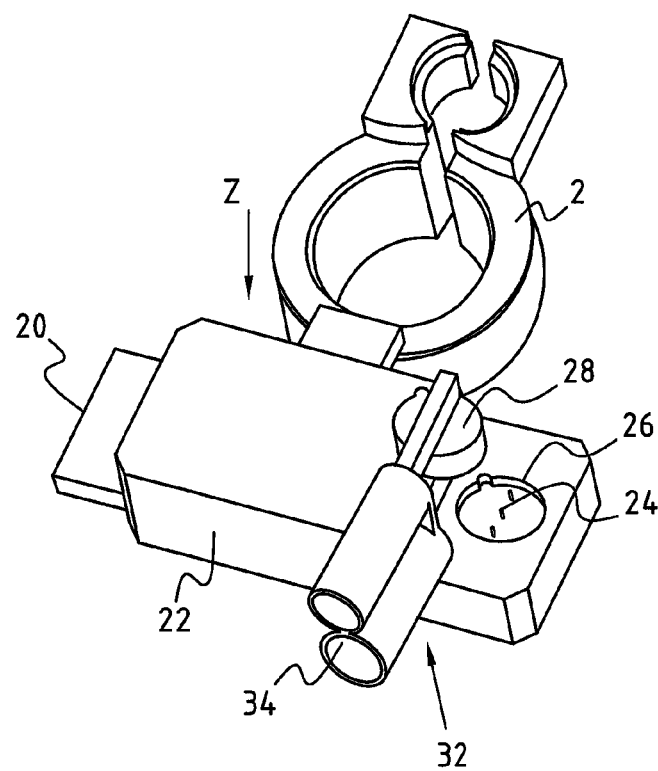
FIG. 8 shows a battery measuring clamp with a data connector.

FIG. 8 shows a battery measuring clamp comprising a battery pole clamp 2, an electrical tap-off 20, a housing 22 and connection means 26. Also shown is a coupling means 28 which can be plugged into the connection means 26 in the insertion direction Z. The coupling means is monolithically connected to a plug face 34. The plug face 34 is contacted to the coupling means 28 via the data connector 32. The outlet of the plug face 34 is in the outlet direction X.

It can also be seen that the connection means 26 is located outside a projection surface in the direction X of the battery pole clamp 2, so that the plug face 34 can point either in the direction shown or in a direction offset by 180° thereto, i.e. towards the battery pole clamp, without the battery pole clamp 2 hindering the outlet of the plug face 34.

Figure 9:
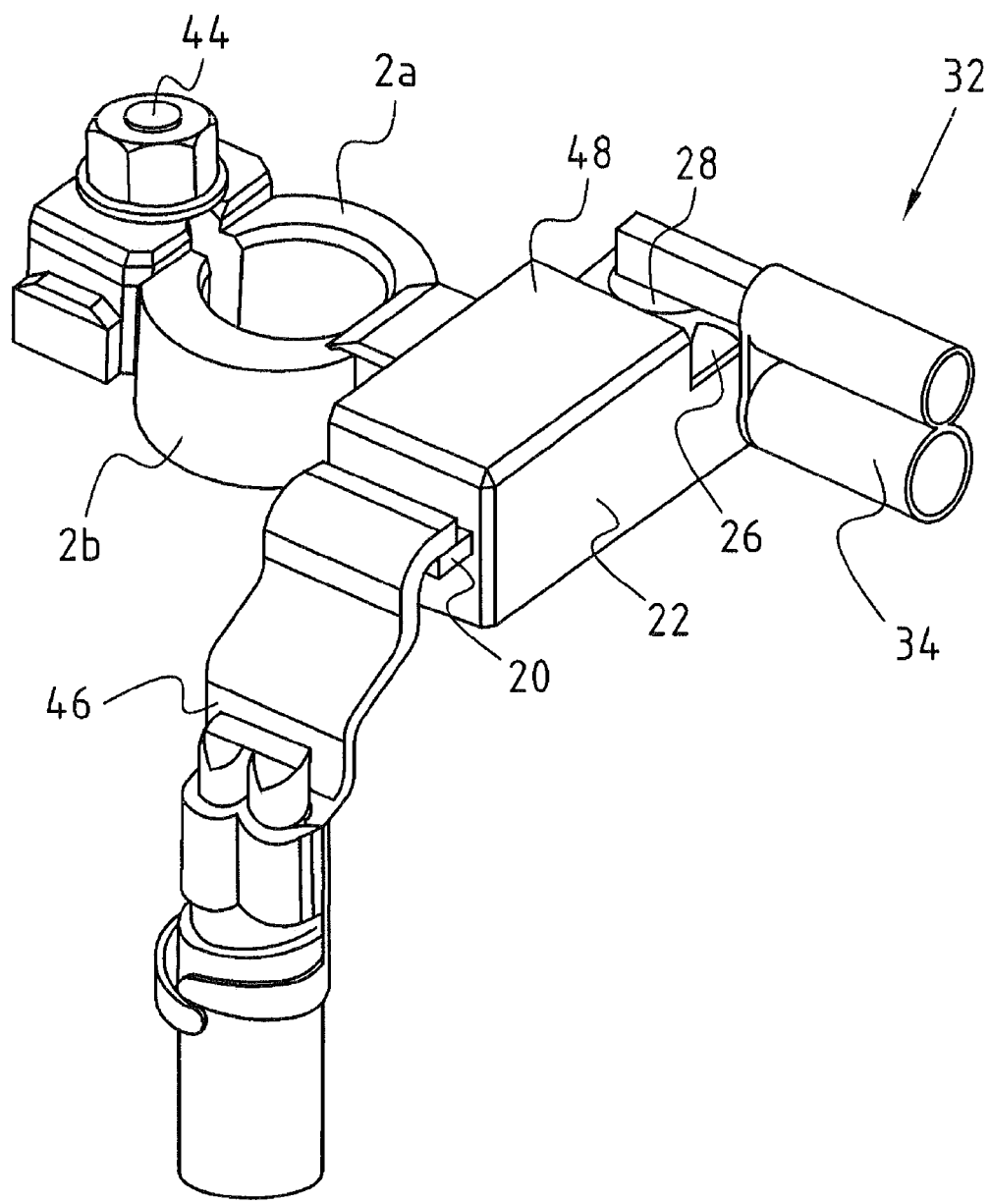
FIG. 9 shows an assembled battery measuring clamp with a data connector and an electrical outlet.

FIG. 9 shows an assembled battery measuring clamp, in which the battery pole clamp 2 is screwed by means of a screw connection 44 so that the clamping jaws are drawn together. The housing 22 can be seen. Arranged on the electrical tap-off 20 is a cable shoe 46, via which an electrical cable is contacted to the electrical tap-off 20. Contact pins may also optionally be arranged in addition, e.g. as screw connection points on the tap-off 20. Such a contacting can be made possible for example in a materially bonded manner by means of welding.

A cover 48 can also be seen. The cover 48 closes the housing 22 in such a way that the evaluation circuit is sealed off. The cover 48 can be connected to the housing 22 in a materially bonded manner by means of laser welding processes. The cover 48 may also be connected to the housing 22 by means of other welding processes, e.g. ultrasonic welding, or by means of gluing.

The plug face 34 of the data connector 32 points away from the battery pole clamp 2. The coupling means 28 with the data connector 32 is connected to the connection means 26 with a force fit. Provided in the plug face 34 are the electrical contacts which are connected to the electrical contacts 24 via the data connector 32, the coupling means 28 and the connection means 26.

Figure 10A:
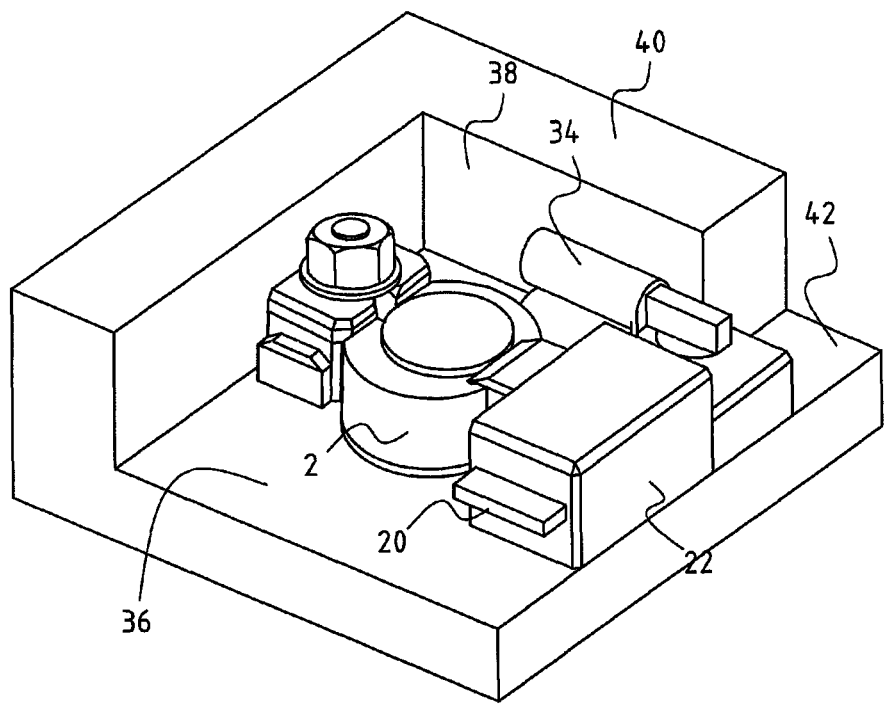
FIGS. 10a-d show different installation variants of battery measuring clamps according to the invention.

FIG. 10a shows a first possible embodiment, in which the plug face 34 of the data connector 32 is arranged in a pole recess 36. It can be seen that the plug face 34 of the data connector 32 is arranged between the battery pole with the battery pole clamp 2 and a wall 38 in the pole recess 36 of the battery 40.

Figure 10B:
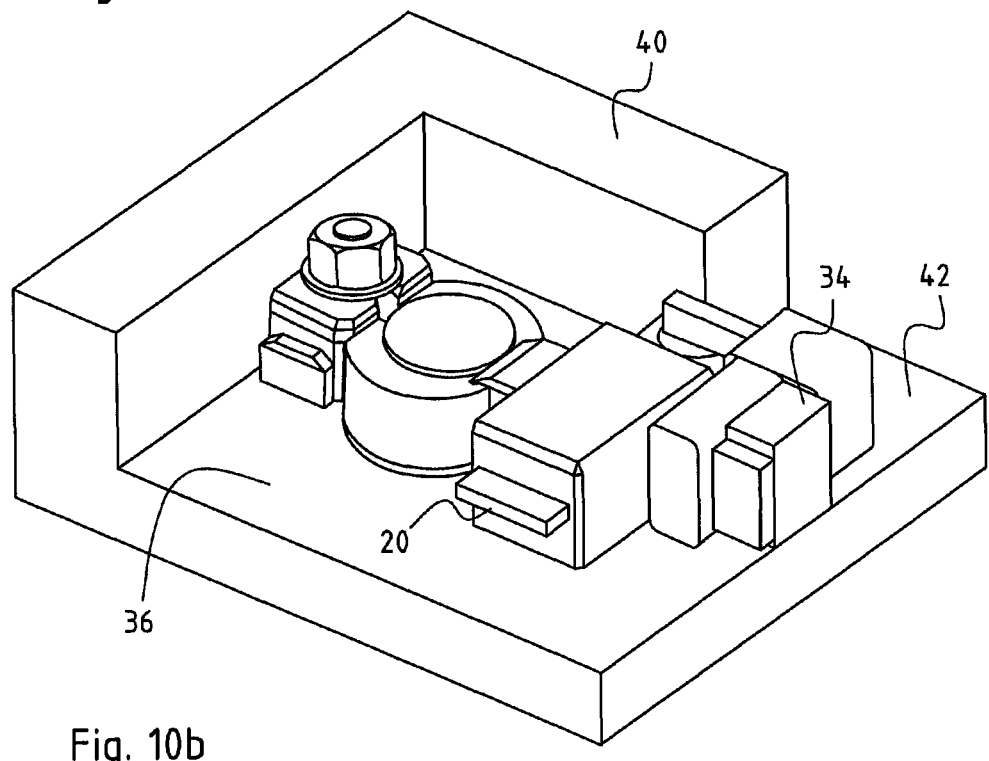

FIG. 10b shows a further embodiment, in which the plug face 34 runs parallel to the measuring resistor 12 in the housing 22. The data connector 32 runs parallel to the outer edge 42 of the pole recess 36 of the battery 40.

Figure 10C:
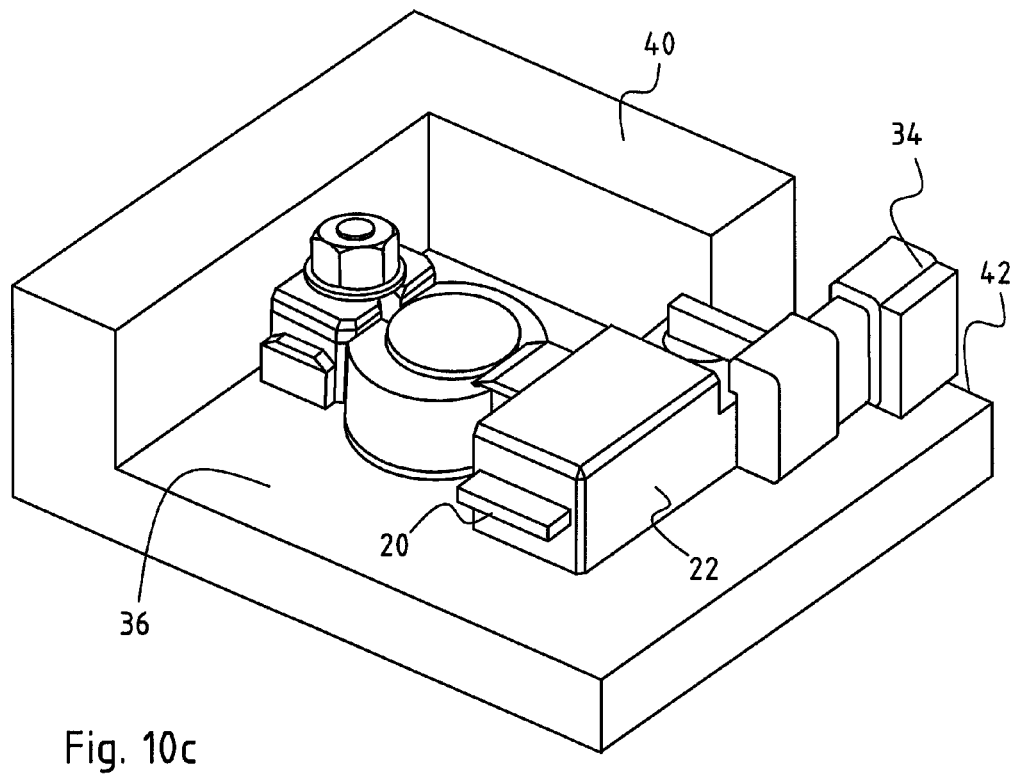

FIG. 10c shows a further configuration of an outlet of a data connector 32. Here too, the plug face 34 is parallel to the outer edge 42 of the battery 40. In contrast to FIG. 10b, however, the plug face 34 points in the direction opposite the electrical tap-off 20.

Figure 10D:
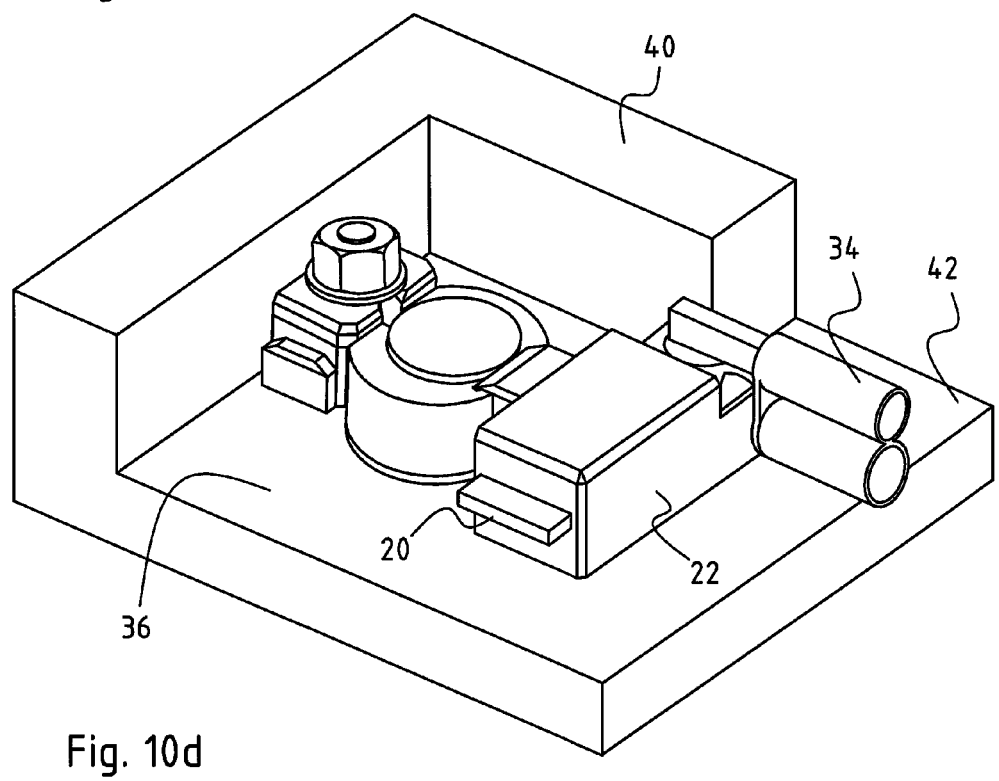

FIG. 10d shows a further configuration, in which the plug face 34 is arranged parallel to the direction X, perpendicular to the outer edge 42 of the battery 40.

Figure 11:
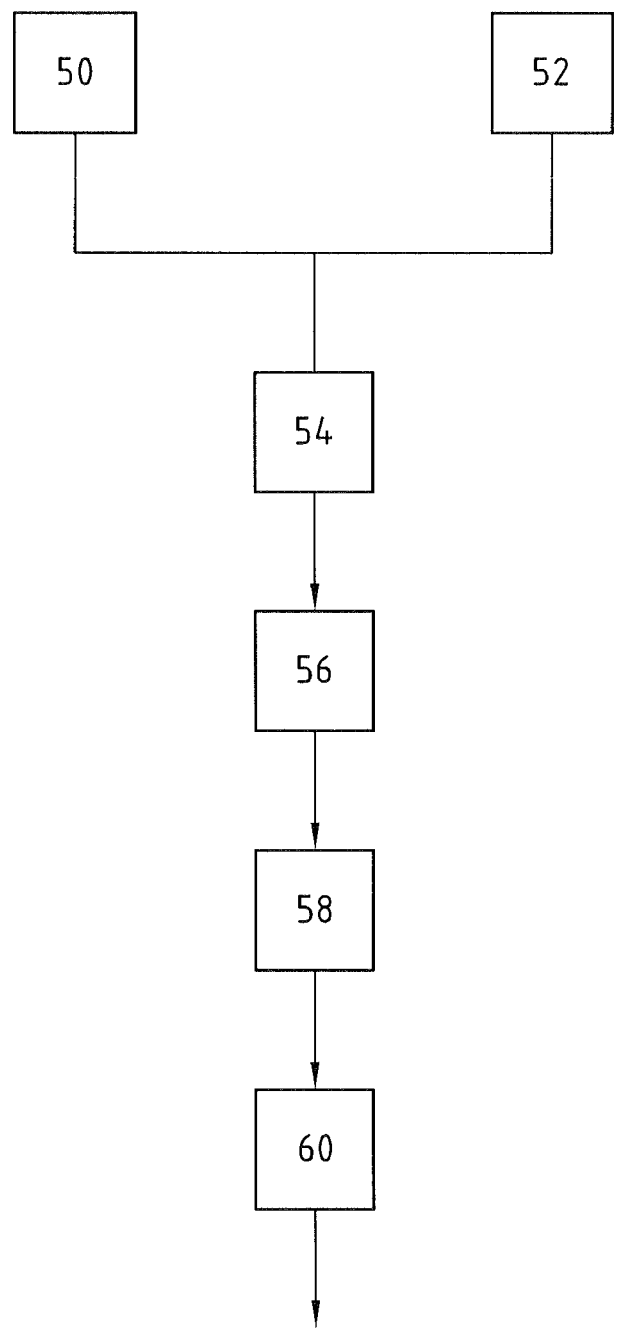
FIG. 11 shows a method according to one exemplary embodiment.

FIG. 11 shows the sequence of a method according to the subject-matter, according to one embodiment. Firstly, a battery clamp 2 as shown in FIG. 1 is forged (50). In parallel with this, a measuring resistor 12 comprising measuring contacts 18 can be produced (52). The battery clamp 2 and the measuring resistor 12 are then connected to one another (54) as shown in FIG. 3. In doing so, a first conductor part 14a can be connected to the connecting bar 8 in a materially bonded manner, for example by soldering. A second conductor part can bear against the insulating bar 10. The coupling bar 4, the measuring resistor 12 and the contacts 24 are then cast into a housing 22 (56). This can take place in such a way that a holder is left in the housing for holding an evaluation circuit. The measuring contacts 18 and also the contacts 24 are located in the holder in such a way as to be able to be electrically contacted by the evaluation circuit.

During the casting (56) of the housing, the latter can be shaped in such a way that the contacts open into the connection means 26 on the side remote from the evaluation circuit and the connection means 26 is shaped as a blind hole for receiving coupling means 28.

The coupling means 28 can be injection-moulded (58) with the plug face 34 of the data connector 32, so that the coupling means 28 is monolithically connected to the plug face 34. Contacts may be arranged in the plug face, which contacts are connected to contacts 30 in the coupling means 28.

Finally, the coupling means 28 can be plugged (60) into the connection means 26.

By virtue of the battery pole clamp according to the subject-matter, it is possible to contact different plug faces 34 in a data connector 32 to a standardised connection means 26 via a standardised coupling means 28. Inexpensive production of a battery measuring clamp is thus possible, which is nevertheless flexible with regard to different customer requirements concerning the data plugs.

What is claimed is:

1. The battery measuring clamp, comprising
   a battery pole clamp;
   a measuring resistor electrically connected to the battery pole clamp; and
   an evaluation circuit, which evaluates at least a voltage across the measuring resistor, the evaluation circuit electrically connected to the measuring resistor via at least two measuring contacts and at least two data lines arranged on the evaluation circuit, wherein the data lines are arranged in an electrical connector, a data connector is monolithically connected to a coupling corresponding to the electrical connector, and the coupling and the electrical connector are plugged together in order to electrically connect the data connector to the data lines.

2. The battery measuring clamp of claim 1, wherein the data connector is injection-molded or cast with the coupling.

3. The battery measuring clamp of claim 1, wherein the data connector is a plug specific to the manufacturer or a socket specific to the manufacturer.

4. The battery measuring clamp of claim 1, wherein the electrical connector and the coupling are a socket and plug pair corresponding to one another.

5. The battery measuring clamp of claim 1, wherein the electrical connector maintains connection to the coupling via at least one of a force and form fit when the electrical connector and the coupling are plugged together.

6. The battery measuring clamp of claim 1, wherein the data connector runs parallel to the extension direction of the measuring resistor.

7. The battery measuring clamp of claim 1, wherein the data connector runs orthogonal to the extension direction of the measuring resistor.

8. The battery measuring clamp of claim 1, wherein the data connector runs in a pole recess between the battery measuring clamp and an outer wall of a battery.

9. The battery measuring clamp of claim 1, wherein the data connector runs parallel to the outer edge of a battery in a pole recess of the battery.

10. The battery measuring clamp of claim 1, wherein the data connector runs perpendicular to the outer edge of a battery in a pole recess of the battery.

11. The battery measuring clamp of claim 1, wherein a coupling bar is arranged in an outlet direction (X) on the battery pole clamp.

12. The battery measuring clamp of claim 11, wherein the coupling bar is a flat part.

13. The battery measuring clamp of claim 1, wherein the measuring resistor is a flat part.

14. The battery measuring clamp of claim 11, wherein the measuring resistor is arranged substantially orthogonal to the outlet direction (X) on the coupling bar.

15. The battery measuring clamp of claim 12, wherein the coupling bar has a connecting bar protruding from the plane of the flat part.

16. The battery measuring clamp of claim 15, wherein an insulating bar is arranged on the plane of the coupling bar, out of which the connecting bar protrudes, on the side of the coupling bar opposite the connecting bar.

17. A battery measuring clamp of claim 15, wherein the measuring resistor bears against the connecting bar and the insulating bar.

18. A battery measuring clamp of claim 16, wherein the measuring resistor is formed of two conductor parts and a resistor material arranged therebetween.

19. A battery measuring clamp of claim 18, wherein one conductor part is arranged on the connecting bar and one conductor part is arranged on the insulating bar.

20. A battery measuring clamp of claim 1, wherein the electrical connector lies outside a projection surface of the battery pole clamp, said projection surface being located in the outlet direction (X).

21. A battery measuring clamp of claim 11, wherein the coupling bar is embedded with the measuring resistor in a material, and in that the measuring contacts and an electrical tap-off on the measuring resistor are free of the material.

22. A battery measuring clamp of claim 11, wherein the coupling bar is embedded with the measuring resistor in a material in such a way that the electrical connector is formed by the material.

23. A battery measuring clamp of claim 21, wherein the electrical connector and the electrical tap-off are arranged on opposite sides of the measuring resistor.

24. A battery measuring clamp of claim 22, wherein the material in the region of the measuring contacts forms a holder for the evaluation circuit.

25. A battery measuring clamp of claim 1, wherein the evaluation circuit is a populated printed circuit board and a populated side of the printed circuit board faces towards the measuring contacts.

26. A battery measuring clamp of claim 21, wherein a cover is arranged over the evaluation circuit in a manner bonded to the material.

27. A method for producing a battery measuring clamp, the method comprising
   electrically connecting a battery pole clamp to a measuring resistor;
   electrically connecting an evaluation circuit to the measuring resistor via at least two measuring contacts;
   arranging at least two data lines in an electrical connector on the evaluation circuit;
   monolithically connecting a data connector to a coupling corresponding to the electrical connector; and
   electrically contacting the data connector to the data lines by plugging together the coupling and the electrical connector.

* * * * *